US010886919B1

(12) United States Patent
Myers et al.

(10) Patent No.: US 10,886,919 B1
(45) Date of Patent: Jan. 5, 2021

(54) CLOCK ADJUSTING TECHNIQUES

(71) Applicant: Arm Limited, Cambridge (GB)

(72) Inventors: James Edward Myers, Bottisham (GB); Philex Ming-Yan Fan, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/705,099

(22) Filed: Dec. 5, 2019

(51) Int. Cl.
*H03K 19/00* (2006.01)
*G06F 1/324* (2019.01)
*G06F 1/14* (2006.01)
*G06F 1/08* (2006.01)

(52) U.S. Cl.
CPC ........... *H03K 19/0016* (2013.01); *G06F 1/08* (2013.01); *G06F 1/14* (2013.01); *G06F 1/324* (2013.01)

(58) Field of Classification Search
CPC ....... H03K 19/0016; G06F 1/14; G06F 1/324; G06F 1/08
USPC .......................................................... 326/93
See application file for complete search history.

(56) References Cited

U.S. PATENT DOCUMENTS

| | | | | |
|---|---|---|---|---|
| 6,115,823 A * | 9/2000 | Velasco | ................. | G06F 1/3203 710/16 |
| 7,111,179 B1 * | 9/2006 | Girson | .................. | G06F 1/3203 713/300 |
| 9,310,864 B1 * | 4/2016 | Klein | ........................ | G06F 1/26 |
| 2009/0204830 A1 * | 8/2009 | Frid | ......................... | G06F 1/324 713/322 |
| 2011/0010567 A1 * | 1/2011 | Schmitz | ................. | G06F 1/3296 713/300 |
| 2011/0248785 A1 * | 10/2011 | Lin | ........................... | G06F 1/08 331/34 |
| 2012/0297232 A1 * | 11/2012 | Bircher | ................... | G06F 1/324 713/500 |
| 2013/0002314 A1 * | 1/2013 | Sheafor | ................. | H03K 21/023 327/115 |
| 2016/0066280 A1 * | 3/2016 | Heo | ................... | H04W 52/0261 455/574 |
| 2017/0063380 A1 * | 3/2017 | Shirotori | ............... | H03B 5/1265 |
| 2018/0039324 A1 * | 2/2018 | Lee | ......... | G06F 1/3212 |
| 2019/0318127 A1 * | 10/2019 | Pan | ......................... | G06F 21/60 |

* cited by examiner

*Primary Examiner* — Don P Le
(74) *Attorney, Agent, or Firm* — Pramudji Law Group PLLC; Ari Pramudji (57) ABSTRACT

Various implementations described herein refer to a method for providing an integrated circuit with a real-time clock source. The method may include generating a real-time clock signal for the integrated circuit with the real-time clock source. The method may include selectively adjusting clock frequency of the real-time clock signal to save power in the integrated circuit.

18 Claims, 4 Drawing Sheets

CLOCK ADJUSTING TECHNIQUES

STATEMENT AS TO FEDERALLY-SPONSORED RESEARCH

This invention was made with Government support under Agreement No. HR0011-17-9-0025, awarded by DARPA. The Government has certain rights in the invention.

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional computing systems, micro-controller units (MCUs) are used for embedded applications, and MCUs are used for automatically controlling various types of devices, such as automobile engine control systems, implantable medical devices, remote controllers, office machines, appliances, and other embedded systems. MCUs typically reduce size and cost of computer designs thus providing an economical means for digital control of all types of systems, devices and processes. For instance, in reference to the Internet-of-things (IoT) devices, MCUs provide an economical means for data collection, sensing, and actuating the physical world as edge devices. MCUs have an ability to retain functionality while waiting for an event such as a button press or other interrupt, and MCUs typically consume less power in standby. However, to extend battery life, MCU designs need to improve power management to increase efficiency and reliability.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to clock scaling and adjustment schemes and techniques. For instance, the various schemes and techniques described herein may provide for a system of mechanisms that are used for dynamically adjusting real-time clock (RTC) frequency in always-on circuitry during a standby mode of operation when an always-on system continuously operates. As such, in some instances, various clock adjusting schemes and techniques described herein may be used to reduce standby power that always-on subsystems consume when an internal subsystem sleeps, e.g., in a low power mode of operation. Also, various schemes and techniques described herein may provide for a hardware (HW) power management scheme that automatically adjusts the real-time clock frequency to match an application-specific wake-up resolution, to thereby save standby power without effecting usability penalty.

In some implementations, the schemes and techniques described herein may provide for a system or device that includes logic circuitry and timer circuitry. For instance, the logic circuitry may have an on-chip clock source that provides a real-time clock (RTC) signal with an oscillating frequency. Also, in this instance, the timer circuitry may receive the real-time clock (RTC) signal from the on-chip clock source and selectively scale the oscillating frequency of the real-time clock (RTC) signal so as to thereby save power in the logic circuitry. In some instances, the logic circuitry may be configured to continuously operate with always-on activity, and also, the on-chip clock source may be configured as an on-chip oscillator. The logic circuitry may be configured to selectively scale the clock frequency of the real-time clock (RTC) signal by dynamically reducing the clock frequency of the real-time clock (RTC) signal provided by the on-chip oscillator so as to save power in the logic circuitry. In some instances, the timer circuitry may be configured to generate an increment value for the real-time clock (RTC) signal and selectively adjust the increment value to compensate for various changes in the clock frequency of the real-time clock (RTC) signal. The timer circuitry may be configured to selectively adjust the increment value by selectively increasing and/or by selectively decreasing the increment value so as to thereby compensate for the various changes in the clock frequency of the real-time clock (RTC) signal.

Various implementations of clock scaling and adjustment techniques will be described in detail herein with reference to FIGS. 1-4.

Figure 1:
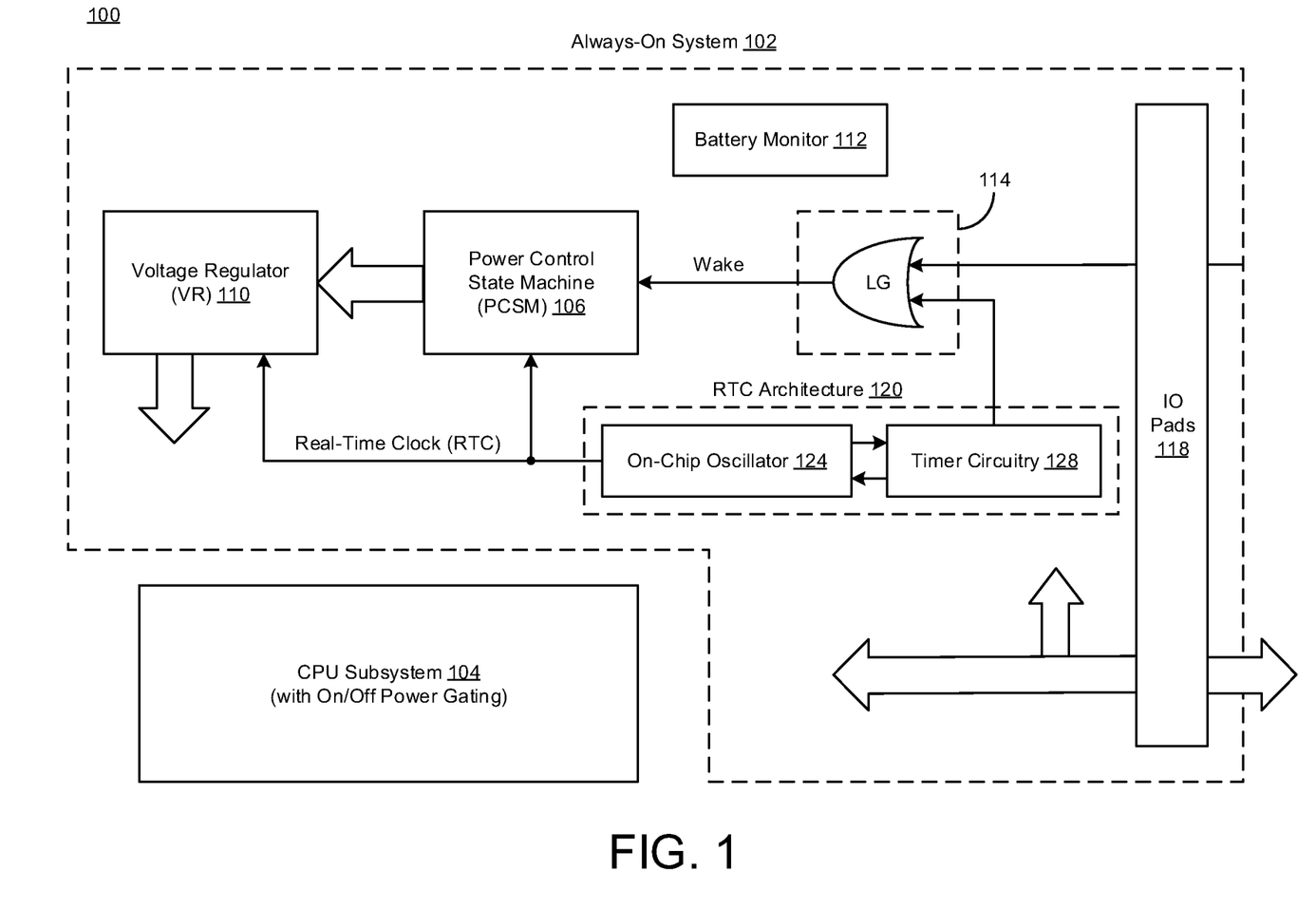
FIG. 1 illustrates a diagram of integrated circuitry in accordance with various implementations described herein.

FIG. 1 illustrates a diagram of integrated circuitry (IC) 100 in accordance with various implementations described herein. In some instances, the integrated circuitry 100 may be implemented as an always-on subsystem 102 (or device, or other logic circuit) having various circuit components that continuously operate with always-on activity using a real-time clock (RTC) source, such as, e.g., an on-chip oscillator 124. The circuit components are arranged and coupled together as an assemblage or combination of parts that provide for a physical circuit layout design and other related structures. Also, in other instances, a method of designing, providing and building the integrated circuitry 100 may involve use of the various circuit components described herein so as to thereby implement the clock scaling and adjustment schemes and techniques associated therewith.

As shown in FIG. 1, the integrated circuitry 100 includes various circuit components, such as, e.g., an always-on subsystem 102, CPU subsystem circuitry 104, power control state machine circuitry 106, voltage regulator (VR) circuitry 110, battery monitor circuitry 112, logic gate circuitry 114, input-output (IO) pad circuitry 118, and real-time clock (RTC) architecture circuitry 120. In some instances, the integrated circuitry 100 may be implemented with various logic circuitry that may continuously operate with always-on activity. The real-time clock (RTC) architecture circuitry 120 may include various circuit components, such as, e.g., an on-chip oscillator 124 and timer circuitry 128.

The CPU subsystem circuitry 104 may include on/off power-gating circuitry that allows for operating in a sleep/ standby mode, and the RTC architecture 120 may be used to reduce standby power that the always-on subsystem 102 consumes in situations when the CPU subsystem 104 sleeps, e.g., in a low power mode of operation. The CPU subsystem 104 may provide real-time response to events related to the always-on subsystem 102. When particular events occur, an interrupt pin may signal the CPU subsystem 104 to suspend processing current instruction sequences and begin an interrupt service routine (ISR), which may perform any processing based on the source of the interrupt, before returning to the original instruction sequence. In reference to power consumption, interrupts may also wake the CPU subsystem 104 from a low power sleep state. In some instances, any adjustment to clock frequency of the real-time clock (RTC) signal, such as, e.g., scaling the clock frequency of the RTC signal, may be achieved automatically when triggered by lower precision wake-up requests.

The power control state machine (PCSM) circuitry 106 receives a wake control signal (Wake) from the logic gate circuitry 114, receives the real-time clock (RTC) signal from the on-chip oscillator 124, and provides one or more power control signals to the voltage regulator (VR) circuitry 110. The power control state machine (PCSM) 106 may include a number of states that may increase or decrease performance of the CPU subsystem 104 at standard mode of operation via the voltage regulator (VR) circuitry 110. When the CPU subsystem 104 is at low power mode of operation, the power control state machine (PCSM) 104 deactivates the voltage regulator (VR) circuitry 110, which supplies power to the CPU subsystem 104, until the flag of the wake-up signal from the real-time clock (RTC) architecture circuitry 120 via the logic gate circuitry 114.

The voltage regulator (VR) circuitry 110 may receive one or more power control signals from the power control state machine (PCSM) circuitry 106, receive the real-time clock (RTC) signal from the on-chip oscillator 124, and provide one or more output signals to various circuit components in the always-on subsystem 102. Upon receiving the power control signals from the power control state machine (PCSM) circuitry 106, the voltage regulator (VR) 110 dynamically changes performance of the CPU subsystem 104 at standard mode of operation. At standard mode of operation, the voltage regulator (VR) 110 increases or decreases its output voltage, which is the supply voltage of the CPU subsystem 104, so as to increase or decrease performance of the CPU subsystem 104, respectively. At the low power mode of operation of the CPU subsystem 104, the voltage regulator (VR) 110 is deactivated and so is its output voltage (i.e., the supply voltage of the CPU subsystem 104). At the low power mode of operation, the voltage regulator (VR) 110 receives the power control signals from the power control state machine (PCSM) circuitry 106 and activates its output voltage, and then the CPU subsystem 104 operates at standard mode. The voltage regulator (VR) 110 may receive the real-time clock (RTC) signal from the on-chip oscillator 124, as a clock signal source for internal circuitry of the voltage regulator (VR) 110. The internal circuitry of the voltage regulator (VR) 110 may convert the power control signals from the power control state machine (PCSM) circuitry 106 to a controllable output voltage, so as to dynamically change the performance of the CPU subsystem 104 in the standard mode of operation.

The battery monitor circuitry 112 may refer to voltage monitoring circuitry that is configured to protect the always-on subsystem 102 from operating outside a safe operating area. In some instances, the battery monitor circuitry 112 of the always-on subsystem 102 may be used to obtain real-time battery voltage information and avoid over-voltage or under-voltage operation of the always-on subsystem 102. Also, in some instances, the battery voltage range may be wider than the voltage operation range of the always-on subsystem 102.

The logic gate circuitry 114 may include one or more logic gates, such as, e.g., an OR gate, that selectively receives a control signal from the timer circuitry 128, receives an input signal from the 10 pad circuitry 118, and provides a wake control signal (Wake) to the power control state machine circuitry 106. The input-output (IO) pad circuitry 118 may include one or more circuits that are configured to protect the always-on subsystem 102 and the CPU subsystem 104 from damage caused by electro-static discharge (ESD).

The real-time clock (RTC) architecture circuitry 120 may include various circuit components, such as, e.g., on-chip oscillator circuitry 124 and timer circuitry 128. In some instances, the on-chip oscillator 124 may be implemented as an RTC source having clock circuitry that is configured to generate an RTC signal (having an oscillating frequency) for the always-on logic circuitry 102. The oscillating frequency of the RTC signal may also be referred to as a clock frequency, such as, e.g., a real-time clock frequency. The timer circuitry 128 may include counter circuitry that receives the RTC signal and counts toggles of the RTC signal provided by the on-chip oscillator 124 as an on-chip RTC source. Also, the timer circuitry 128 may be configured to selectively adjust the clock frequency of the RTC signal to save (or conserve) power in the always-on logic circuitry 102. As such, the clock circuitry may refer to an on-chip oscillator 124 (or similar circuitry) that is configured to generate and provide the RTC signal to the always-on logic circuitry 102.

In some implementations, the on-chip oscillator 124 may refer to various types of oscillators, such as, e.g., resistor-capacitor (RC) oscillator, switched capacitor network, gate leakage, etc. Thus, in this instance, the timer circuitry 128 may be configured with a frequency scaling capability and a frequency control signal so as to selectively scale the oscillating clock frequency of the real-time clock (RTC) signal as provided by the on-chip oscillator 124.

In some implementations, the timer circuitry 128 may be configured for various activities. For instance, the timer circuitry 128 may be configured to selectively adjust the clock frequency of the RTC signal by dynamically lowering the clock frequency of the RTC signal that is provided by the on-chip oscillator so as to save power in the always-on logic circuitry 102. In some instances, the timer circuitry 128 may be configured to activate a timed-shutdown of the CPU subsystem 104, and also, the timer circuitry 128 may be configured to selectively adjust the clock frequency of the RTC signal by entering a standby mode of operation (or low power mode) to thereby dynamically reduce the clock frequency of the RTC signal so as to thereby save power in the always-on logic circuitry 102. In some instances, the timer circuitry 128 may be configured to activate a timed-wake-up of the CPU subsystem 104 after activating the timed-shutdown of the CPU subsystem 104, and also, the timer circuitry 128 may be configured to selectively adjust clock frequency of the RTC signal by entering a standard mode of operation (or normal mode) to thereby dynamically increase the clock frequency of the RTC signal in response to wake-up of the CPU subsystem 104 from the standby mode (or low power mode) to the standard mode of operation.

In some implementations, the timer circuitry 128 may be configured for various other activities. In some instances, the timer circuitry 128 may be configured to selectively adjust the increment value by selectively increasing or selectively decreasing the increment value to compensate for various changes in the clock frequency of the RTC signal. As shown in FIG. 1, the on-chip oscillator 124 may provide an output to the timer circuitry 128, and the output of the on-chip oscillator 124 may be scaled by the timer circuitry 128. In this instance, the timer circuitry 128 may generate the real-time count value (RTV) of the RTC signal from the on-chip oscillator 124, and also, the timer circuitry 128 may compensate for various changes in the RTC signal by adjusting the increment/decrement value so as to not affect the RTV, which operates to adjust the scaled oscillator output.

In some instances, the clock power of the RTC architecture 120 may dominate deep sleep modes, and power may be consumed at different rates depending on activity of the RTC. The power consumed when RTC is disabled (e.g., when RTC running at 0 kHz, while entering shutdown mode with external wake-up only) is less than the power consumed when RTC is enabled (e.g., when RTC running at >0 kHz, when entering timed-shutdown mode with internal wake-up). While in the timed-shutdown mode, the power control state machine (PCSM) and digital timers may be running and clocked by the RTC, accounting for much of the power consumption. Therefore, reducing the RTC frequency may reduce the timed-shutdown power significantly, but may decrease precision of shutdown intervals and reduce precision of the RTC used in active mode. As such, the various clock scaling and adjustment schemes and techniques described herein seek to take advantage of the on-chip real-time clock source and codesign of the timers, so as to dynamically alter the operating frequency of the RTC and save (or conserve) power, while still providing a same precision of the RTC without any additional software management.

Figure 2:
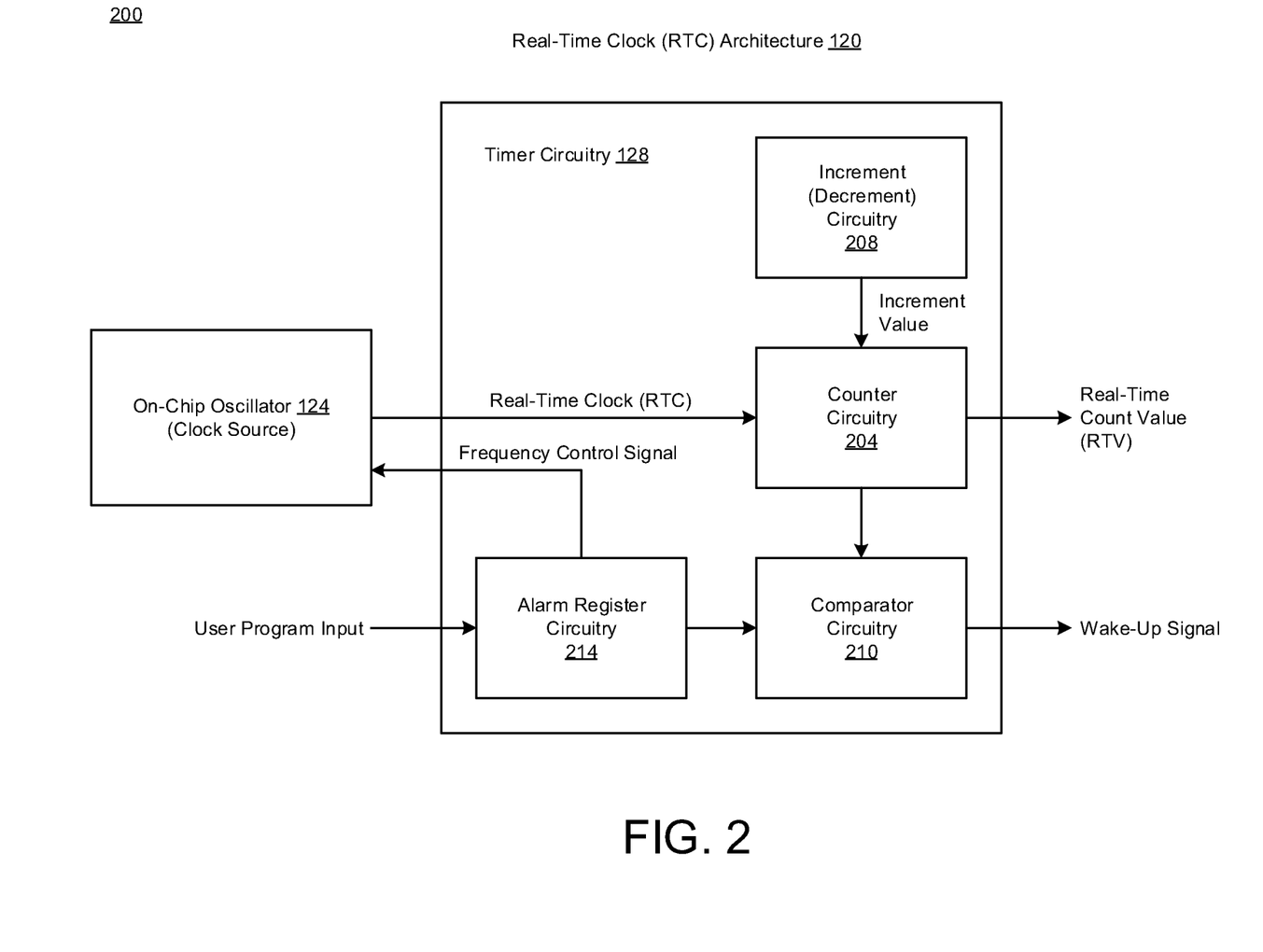
FIG. 2 illustrates a diagram of real-time (RTC) clock architecture and circuitry in accordance with various implementations described herein.

FIG. 2 illustrates a diagram of the real-time clock (RTC) architecture 120 and related circuitry in accordance with various implementations described herein.

In reference to FIG. 2, the real-time clock (RTC) architecture 120 may include the on-chip oscillator 124 and the timer circuitry 128. The on-chip oscillator 124 may be referred to as a clock source, such as, e.g., an on-chip real-time clock source. As shown, the on-chip oscillator 124 may communicate with the timer circuitry 128 by receiving an alarm control signal from the timer circuitry 128 and by providing a real-time clock (RTC) signal to the timer circuitry 128. In various implementations, the on-chip oscillator 124 may be configured to operate as a clock source that generates and provides an oscillating clock signal with a clock frequency, and thus, the on-chip oscillator 124 may be configured to operate as various types of oscillators, such as, e.g., resistor-capacitor (RC) oscillator circuitry, switched capacitor (SC) network circuitry, gate leakage type circuitry, etc.

In some instances, the timer circuitry 128 may include various types of circuitry, such as, e.g., counter circuitry 204, increment circuitry 208, comparator circuitry 210, and alarm register circuitry 214, that are configured to selectively adjust clock frequency of the real-time clock (RTC) signal to save power in the always-on subsystem 102. The counter circuitry 204 may be referred to as real-time counter circuitry having a digital counter that receives the real-time clock (RTC) signal from the on-chip oscillator 124, counts the clock pulses (or toggles) of the RTC signal, and provides a real-time count value (RTV) of the RTC signal. The real-time counter circuitry 204 may provide the RTV as an output and/or as a control signal to the comparator circuitry 210.

The increment circuitry 208 generates and provides an increment value to the counter circuitry 204 to adjust the RTC signal. In some instances, the increment circuitry 208 may also be configured as decrement circuitry that provides a decrement value to the counter circuitry 204 to adjust the RTC signal. In some instances, selectively increasing the increment value may decrease the clock frequency of the RTC signal, and selectively decreasing the increment value may increase the clock frequency of the (RTC) signal.

The comparator circuitry 210 may receive the real-time count value (RTV) from the counter circuitry 204 and compare the RTV to other count values. As described herein, the timer circuitry 128 may be configured to dynamically scale the clock frequency of the RTC signal by reducing the clock frequency of the RTC signal that is provided by the on-chip oscillator 124 so as to save (or conserve) power in the always-on subsystem 102. In some instances, the timer circuitry 128 may selectively adjust the clock frequency by selectively lowering the clock frequency in a low power mode of operation to save power, and the low power mode of operation may refer to a deep sleep mode of operation.

The alarm register circuitry 214 may receive user program input and provide the frequency control signal to the on-chip oscillator 124. The alarm register circuitry 214 may also provide another control signal to the comparator circuitry 210. In some instances, the timer circuitry 128 may be configured to selectively increase the clock frequency of the RTC signal in response to wake-up signal provided to wake the CPU subsystem 104 from the low power mode to a standard mode of operation based on the alarm control signal. In some instances, scaling the clock frequency of the RTC signal is achieved automatically when triggered by lower precision wake-up requests. For instance, if the wake-up interval value is 117 (i.e., 117 toggles of RTC), then this value cannot be reduced by some multiple of 4/8/16 and, thus, full RTC precision must be maintained. However, if the wake-up interval was 120 (toggles of RTC), then the real-time clock (RTC) source may be reduced by 8×, and the real-time counter circuitry 204 will increment in (15) steps of 8 for the same functionality at lower power.

In some implementations, when user program input is received by the wake-up timer or alarm register circuitry 214, the value of the timed-shutdown interval may be checked by the comparator 210 against a set of supported clock frequencies. If a suitable lower frequency is found, then the suitable lower frequency is selected once timed-shutdown has been entered. In some instances, to ensure correctness of the real-time clock value (RTV), the counter 204 may be incremented and updated accordingly, such as, e.g., 8× slower clock may require addition (or increment) of 8 rather than 1. In this instance, the real-time clock value (RTV) may be used to maintain the original precision, while reducing RTC dynamic power by up to 8×. Also, the least significant bits (LSB) in the counter 204 may be ignored depending on the selected precision.

In some implementations, selectively adjusting the clock frequency may refer to managing power of the always-on subsystem 102 using a power management technique during the low power mode of operation that automatically adjusts the clock frequency of the RTC signal to save power in the always-on subsystem 102. Also, in some instances, the timer circuitry 128 may be configured to activate a timed-shutdown of the CPU subsystem 104 by entering the low power mode of operation to thereby dynamically adjust the clock frequency of the RTC signal to save power in the always-on subsystem 102.

Figure 3:
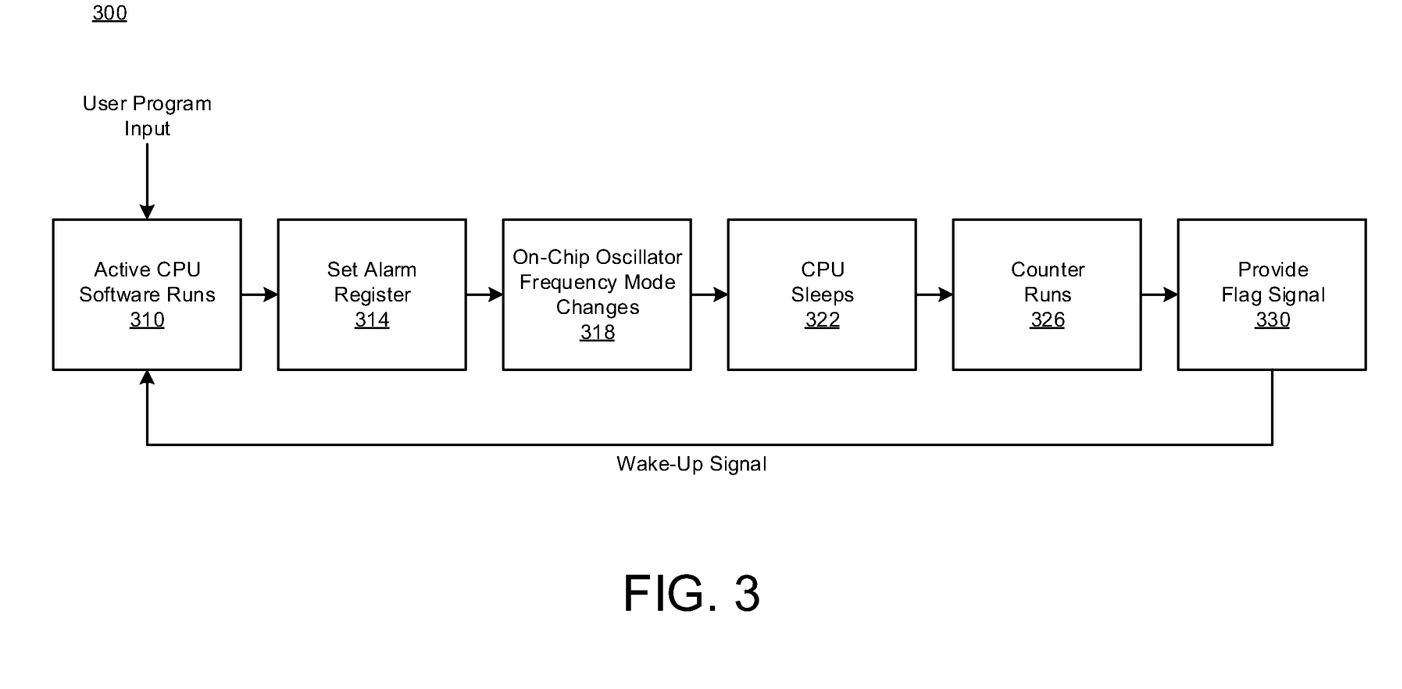
FIG. 3 illustrates a process flow diagram of generating a real-time count value in accordance with various implementations described herein.

FIG. 3 illustrates a process diagram of a method 300 for generating a real-time count value (RTV) in accordance with various implementations described herein.

It should be understood that even though method 300 indicates a particular order of operation execution, in some cases, various certain portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or circuitry, as described herein in reference to FIGS. 1-2. Also, if implemented in software, method 300 may be implemented as a program and/or software instruction process configured for performing clock adjustment schemes and techniques, as described herein. Also, if implemented in software, instructions related to implementing the method 300 may be stored in memory and/or a database. For instance, a computer or various other types of computing devices having a processor and memory may be configured to perform method 300.

As shown in FIG. 3, in block 310, method 300 manages active software runs for the CPU subsystem 104 (FIG. 1) based on user program input. In block 314, method 300 sets the alarm register. In block 318, method 300 may determine frequency mode changes for the on-chip oscillator 124 (FIGS. 1-2). In block 322, method 300 provides for a timed-shutdown interval that allows the CPU subsystem 104 to enter a sleep mode of operation. In various instances, the sleep mode of operation may refer to a low power mode, a standby mode, or a deep sleep mode of operation.

In block 326, method 300 may provide for counter runs, wherein the counter generates a real-time count value (RTV) of the real-time clock (RTC) signal. In block 330, method 300 may provide a flag signal to wake-up the CPU. From block 330, method 300 provides a wake-up signal to the CPU subsystem 104 (FIG. 1), and also, method 300 returns to block 310 to manage the active software runs of the CPU subsystem 104 (FIG. 1).

Figure 4:
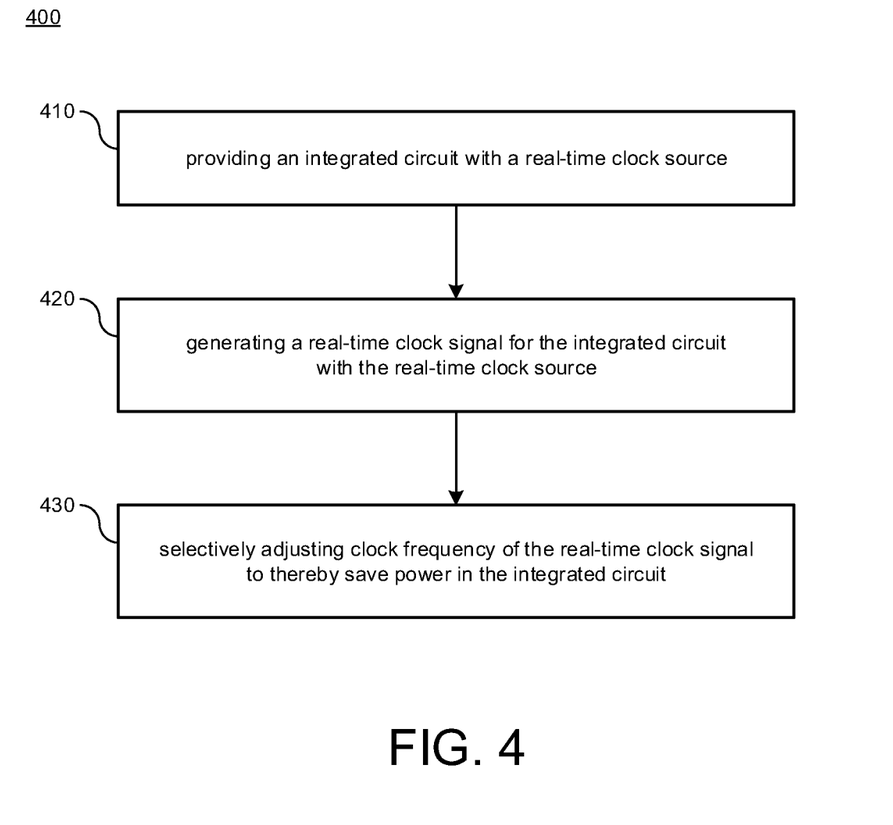
FIG. 4 illustrates a process flow diagram of a method for performing clock adjusting techniques in accordance with various implementations described herein.

FIG. 4 illustrates a process flow diagram of a method 400 for performing clock adjusting techniques in accordance with various implementations described herein.

It should be understood that even though method 400 indicates a particular order of operation execution, in some cases, various certain portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1-3. Also, if implemented in software, method 400 may be implemented as a program and/or software instruction process configured for performing clock adjustment schemes and techniques, as described herein. Also, if implemented in software, instructions related to implementing the method 400 may be stored in memory and/or a database. For instance, a computer or various other types of computing devices having a processor and memory may be configured to perform method 400.

At block 410, method 400 may provide an integrated circuit (IC) with a real-time clock (RTC) source. In some instances, the integrated circuit (IC) may include always-on logic circuitry that continuously operates with always-on activity. Also, the real-time clock (RTC) source may include an on-chip oscillator that is configured to generate a real-time clock (RTC) signal so as to save power in the always-on logic circuitry. Also, in some instances, the integrated circuit (IC) may include real-time counter circuitry configured to count toggles of the real-time clock (RTC) signal provided by the real-time clock (RTC) source. At block 420, method 400 may generate the real-time clock (RTC) signal for the integrated circuit (IC) with the real-time clock (RTC) source.

At block 430, method 400 may selectively adjust the clock frequency of the real-time clock (RTC) signal to save power in the integrated circuit (IC). In some instances, selectively adjusting the clock frequency refers to dynamically scaling the clock frequency of the real-time clock (RTC) signal by reducing the clock frequency of the real-time clock (RTC) signal that is provided by the on-chip oscillator so as to save power in the integrated circuit. In some instances, selectively adjusting the clock frequency refers to selectively lowering the clock frequency in a low power mode of operation to save power, and also, the low power mode of operation may refer to a sleep mode of operation including a deep sleep mode of operation. In some instances, the low power mode of operation may refer to a standby mode of operation.

In some implementations, method 400 may include selectively increasing the clock frequency of the real-time clock (RTC) signal to wake-up the integrated circuit (IC) from the low power mode to a standard mode of operation. In some instances, method 400 may include activating a timed-shutdown of the integrated circuit and also selectively adjusting the clock frequency of the real-time clock (RTC) signal by entering the low power mode of operation (or standby mode) to thereby dynamically adjust the clock frequency of the real-time clock (RTC) signal to save power in the integrated circuit (IC). In some instances, scaling the clock frequency may be achieved automatically when triggered by lower precision wake-up requests.

In some implementations, the real-time count value (RTV) may be kept the same independent of the clock frequency of the real-time clock signal (RTC). If reference to the increment (decrement) circuitry 208, the increment value (or weight thereof) from increment (decrement) circuitry may change (or be adjusted) based on frequency change of the RTC signal so as to maintain the RTV as unaffected. I.e., when wake-up signal has preset value=RTV=(value of clock frequency of RTC) x (increment value or weight from increment/decrement circuitry 208). For instance, if the RTV to count is 1 second in real world, when using 10 kHz as the clock frequency of the RTC, the RTV=10000 counts at the 1-second time interval assuming the weight or value of the increment (decrement) circuitry is 1. The wake-up signal flags when the comparator circuitry compares RTV with the pre-set value=10000. To save power, the clock frequency of the RTC may be reduced to 1 kHz. If the increment value or weight from the increment (decrement) circuitry 208 remains at 1, then the wake-up signal flags when the RTV=10000, but actual time interval is 10 seconds rather than 1 second. As such, the increment value or weight from the increment (decrement) circuitry may increment by 10, so as to obtain a correct RTV. In some instances, the increment value or weight from the increment (decrement) circuitry 208 may change binarily between 1, 2, 4, 8 and so on, because the bit change may be implemented by shifting the least-significant bit (LSB) in digital circuitry.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a method. The method may include providing an integrated circuit with a real-time clock source. The method may include generating a real-time clock signal for the integrated circuit with the real-time clock source. The method may include selectively adjusting clock frequency of the real-time clock signal to save power in the integrated circuit.

Described herein are various implementations of a device. The device may include logic circuitry that continuously operates with always-on activity. The device may include clock circuitry that generates a real-time clock signal for the logic circuitry. The device may include timer circuitry that selectively adjusts clock frequency of the real-time clock signal so as to save power in the logic circuitry.

Described herein are various implementations of a system. The system may include logic circuitry having an on-chip clock source that provides a real-time clock signal having an oscillating frequency. The system may include timer circuitry that receives the real-time clock signal from the on-chip clock source and selectively scales the oscillating frequency of the real-time clock signal so as to save power in the logic circuitry.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
  providing an integrated circuit with a real-time clock source;
  generating a real-time clock signal for the integrated circuit with the real-time clock source; and
  selectively adjusting clock frequency of the real-time clock signal to save power in the integrated circuit;
  wherein:
    the integrated circuit comprises always-on logic circuitry that continuously operates with always-on activity,
    the real-time clock source comprises an on-chip oscillator configured to generate the real-time clock signal so as to save power in the always-on logic circuitry, or
    the integrated circuit includes real-time counter circuitry that counts toggles from the real-time clock source.

2. The method of claim 1, wherein selectively adjusting the clock frequency refers to dynamically scaling the clock frequency of the real-time clock signal by reducing the clock frequency of the real-time clock signal that is provided by the on-chip oscillator so as to save power in the integrated circuit.

3. The method of claim 1, wherein:
  selectively adjusting the clock frequency refers to selectively lowering the clock frequency in a low power mode of operation to save power, and wherein the low power mode of operation refers to a deep sleep mode of operation, and
  scaling the clock frequency is achieved automatically when triggered by lower precision wake-up requests.

4. The method of claim 3, further comprising:
  selectively increasing the clock frequency of the real-time clock signal to wake-up the integrated circuit from the low power mode to a standard mode of operation.

5. The method of claim 1, further comprising:
generating an increment value for the real-time clock signal; and
selectively adjusting the increment value to compensate for changes in the clock frequency of the real-time clock signal.

6. The method of claim 5, wherein selectively adjusting the increment value for the real-time clock signal refers to selectively increasing or selectively decreasing the increment value so as to compensate for changes in the clock frequency of the real-time clock signal.

7. The method of claim 6, wherein:
selectively increasing the increment value decreases the clock frequency of the real-time clock signal, and
selectively decreasing the increment value increases the clock frequency of the real-time clock signal.

8. The method of claim 1, wherein selectively adjusting the clock frequency refers to managing power of the integrated circuit using a power management technique during a low power mode of operation that automatically adjusts the clock frequency of the real-time clock signal to save power in the integrated circuit.

9. The method of claim 8, further comprising:
activating a timed-shutdown of the integrated circuit; and
selectively adjusting the clock frequency of the real-time clock signal by entering the low power mode of operation to thereby dynamically adjust the clock frequency of the real-time clock signal to save power in the integrated circuit.

10. A device, comprising:
logic circuitry that continuously operates with always-on activity;
clock circuitry that generates a real-time clock signal for the logic circuitry; and
timer circuitry that selectively adjusts clock frequency of the real-time clock signal so as to save power in the logic circuitry;
wherein the clock circuitry comprises an on-chip oscillator that generates and provides the real-time clock signal to the logic circuitry, or wherein the timer circuitry comprises real-time counter circuitry that receives and counts toggles of the real-time clock signal provided by the real-time clock source.

11. The device of claim 10, wherein the timer circuitry is configured to:
selectively adjust the clock frequency of the real-time clock signal by dynamically lowering the clock frequency of the real-time clock signal that is provided by the on-chip oscillator so as to save power in the logic circuitry.

12. The device of claim 10, wherein the timer circuitry is configured to:
activate a timed-shutdown of the logic circuitry; and
selectively adjust the clock frequency of the real-time clock signal by entering a standby mode of operation to thereby dynamically reduce the clock frequency of the real-time clock signal so as to save power in the logic circuitry.

13. A device, comprising:
logic circuitry that continuously operates with always-on activity;
clock circuitry that generates a real-time clock signal for the logic circuitry; and
timer circuitry that selectively adjusts clock frequency of the real-time clock signal so as to save power in the logic circuitry;
wherein the timer circuitry is configured to:
activate a timed-shutdown of the logic circuitry; and
selectively adjust the clock frequency of the real-time clock signal by entering a standby mode of operation to thereby dynamically reduce the clock frequency of the real-time clock signal so as to save power in the logic circuitry;
wherein the timer circuitry is configured to:
activate a timed-wake-up of the logic circuitry after activating the timed-shutdown of the logic circuitry; and
selectively adjust the clock frequency of the real-time clock signal by entering a standard mode of operation to thereby dynamically increase the clock frequency of the real-time clock signal so as to wake-up the logic circuitry from the standby mode to the standard mode of operation,
wherein scaling the clock frequency is achieved automatically when triggered by lower precision wake-up requests.

14. The device of claim 10, wherein the timer circuitry is configured to:
generate an increment value for the real-time clock signal; and
selectively adjust the increment value to compensate for changes in the clock frequency of the real-time clock signal.

15. The device of claim 14, wherein the timer circuitry is configured to:
selectively adjust the increment value for the real-time clock signal by selectively increasing or selectively decreasing the increment value so as to compensate for changes in the clock frequency of the real-time clock signal.

16. A system, comprising:
logic circuitry having an on-chip clock source that provides a real-time clock signal having an oscillating frequency; and
timer circuitry that receives the real-time clock signal from the on-chip clock source and selectively scales the oscillating frequency of the real-time clock signal so as to save power in the logic circuitry;
wherein:
the logic circuitry continuously operates with always-on activity,
the on-chip clock source comprises an on-chip oscillator, or
the timer circuitry has real-time counter circuitry that counts toggles of the real-time clock signal provided by the on-chip oscillator.

17. The system of claim 16, wherein:
the logic circuitry selectively scales the clock frequency of the real-time clock signal by dynamically reducing the clock frequency of the real-time clock signal provided by the on-chip oscillator so as to save power in the logic circuitry.

18. The system of claim 16, wherein the timer circuitry is configured to:
generate an increment value for the real-time clock signal;
selectively adjust the increment value to compensate for changes in the clock frequency of the real-time clock signal; and
selectively adjust the increment value by increasing or decreasing the increment value so as to compensate for changes in the clock frequency of the real-time clock signal.

* * * * *